United States Patent
Hegrenes et al.

(10) Patent No.: US 6,622,873 B2
(45) Date of Patent: Sep. 23, 2003

(54) SELF-ALIGNING, SINGLE PERSON INSTALLABLE RACK RAIL/ALIGNMENT PLATE ASSEMBLY

(75) Inventors: Aaron Matthew Hegrenes, Rochester, MN (US); Ray Clement Laning, Rochester, MN (US); Stephen Peter Mroz, Rochester, MN (US); Jason Joseph Newton, Rochester, MN (US); Kenneth Robert Peters, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/885,560

(22) Filed: Jun. 20, 2001

(65) Prior Publication Data

US 2002/0195408 A1 Dec. 26, 2002

(51) Int. Cl.⁷ .................................................. A47F 7/00
(52) U.S. Cl. ........................ 211/26; 211/187; 211/190; 361/683
(58) Field of Search ............................ 211/26, 187, 189, 211/190, 191; 361/683

(56) References Cited

U.S. PATENT DOCUMENTS

| 4,331,369 A | 5/1982 | Lazar et al. |
|---|---|---|
| 5,333,950 A | 8/1994 | Zachrai |
| 5,485,932 A | 1/1996 | Romm et al. |
| 5,791,498 A | 8/1998 | Mills |
| 5,913,508 A | 6/1999 | Eades |
| 6,021,909 A | 2/2000 | Tang et al. |
| 6,052,274 A | 4/2000 | Remsburg |
| 6,088,222 A | 7/2000 | Schmitt et al. |
| 6,095,345 A | 8/2000 | Gibbons |
| 6,142,590 A | 11/2000 | Harwell |
| 6,173,848 B1 | 1/2001 | Bravo |
| 6,230,903 B1 * | 5/2001 | Abbott ........................ 361/683 |

* cited by examiner

Primary Examiner—Daniel P. Stodola
Assistant Examiner—Erica B. Harris
(74) Attorney, Agent, or Firm—Wood, Herron & Evans, LLP (57) ABSTRACT

An assembly and associated installation method for a server or other electronic equipment enclosure installable into a rack by a single person without adverse tolerance stack-up problems. A mounting bracket is attached to each end of a sliding rail coupled to the server or other equipment enclosure. The mounting bracket includes pins which are inserted into mounting apertures in the posts of the rack to temporarily retain and hold the sliding rail in the rack. Subsequently, a single user can then insert screws or other mechanical fasteners to securely attach the mounting bracket and sliding rail coupled thereto to the rack. The mounting bracket is fixedly secured to the rack and the sliding rail is permitted to move, translate or pivot relative to the mounting bracket to account for tolerance stack-up issues or other abnormalities in the dimensional fit between the server and rack system. The design of the mounting bracket inhibits appreciable vertical translation of the sliding rail thereby providing for proper clearance for the rack space below.

9 Claims, 6 Drawing Sheets

SELF-ALIGNING, SINGLE PERSON INSTALLABLE RACK RAIL/ALIGNMENT PLATE ASSEMBLY

FIELD OF THE INVENTION

The invention is generally related to an electronic equipment enclosure rack support system. More specifically, the invention is generally related to an electronic equipment enclosure rack support rail system that can be easily utilized by a single installer and accounts for alignment problems during the installation.

BACKGROUND OF THE INVENTION

Computers and data storage equipment, such as servers and the like, are commonly housed in standardized electronic equipment enclosures. These equipment enclosures normally comprise an outer, aesthetically pleasing housing which is supported by a rack. The rack usually comprises a substantially rectilinear metal frame, including several vertical columns or posts each provided with a plurality of holes or apertures which permit the mounting of various equipment hardware in the rack. In the electronic equipment industry, and specifically the server industry, the need to maximize floor space has led to the proliferation of the use of such racks. Designing electronic equipment enclosures and servers to fit into these racks creates several installation and serviceability issues. The individual servers or components to be mounted and supported in the rack are typically supported by support rails that mount to the generally vertical posts of the rack. Normally these rails are screwed or bolted to the rack and the equipment components or servers are each coupled to a set of rails.

Typically, two types of rails are used to support the equipment: stationary or sliding. Sliding rails are usually preferred from a serviceability perspective because they provide the ability to slide a server or other electronic component out of the rack for full access to the entire component. Stationary rails are easily installed, but a server installed on stationary rails is usually restricted only to front and rear access for service. Stationary rails prevent equipment component modules from being removed, replaced or otherwise serviced.

Sliding rails, however, are usually very difficult to install and if done incorrectly, tolerance stack-up can cause the rails to bind or even break when sliding the server or other component into the rack. One specific problem with sliding rails is the challenge for installers of holding one or more components such as servers or other electronic equipment enclosures in one hand and aligning holes located on the components with respect to the mounting apertures in the rack and further placing and screwing a screw with the other hand. Avoiding the need for two people to install a server or other component into the rack is highly desirable. However, two people are often needed. Increased weight or larger dimensions of the server or electronic component make it increasingly difficult for a single installer.

One solution attempted in the industry to enable one person to attach the components to the rack without assistance is to hold the components with a spring clamp or other clamping mechanism. The spring clamp allows the assembler to use one hand to align the screw and the other hand to screw the components together while the spring clamp holds the component in position. However, servers and other electronic components for rack mounting are of various sizes, shapes and weights that make it difficult to find a suitable place for attaching the clamp. Further, heavier components are obviously very difficult to safely and accurately position in the rack with a temporary clamp. Slippage often occurs thereby requiring adjustment and realignment.

Formerly, stationary and sliding rails have been developed that address the multiple-person installation issue. However, such systems do not address the tolerance stack-up issue adequately. Tolerance stack-up problems are generated when the exact dimensions for the mounting hardware on the server or electronic equipment enclosure do not correspond precisely with the mating or otherwise compatible components of the rail and rack. Misalignment is inevitable even with the most conscientious of installers. These tolerance inaccuracies contribute to binding and serviceability issues for the sliding rails and subsequent malfunction, damage or failure of the components. Often, very intricate and detailed installation instructions are required in an attempt to alleviate the tolerance stack-up issue. Another alternative is to loosely install the sliding rails with standard attachment hardware. However, while this may provide a limited solution to the tolerance stack-up issue it also poses a significant safety concern with a possibility of the server or electronic component falling off of the rails and from the rack.

Therefore, it is apparent that there is a need for a cost effective rail attachment mechanism and associated method that provides full access to the server or other electronic component when installed in the rack while providing an easy, preferably one person installation process. Further, installation should avoid the tolerance issues that can cause damage to the rails.

SUMMARY OF THE INVENTION

The invention addresses these and other problems associated with the prior art by providing a self-aligning, single person installable rack rail/alignment assembly and associated installation method. To provide an easily installable, cost effective rack rail assembly and installation for an electronic equipment enclosure, component, server or the like, the present invention in one embodiment utilizes a mounting bracket that is used in combination with a sliding rail assembly. Typical sliding rail assemblies are often complex to install and usually require two people for the installation process. The use of the mounting bracket with a sliding rack rail transforms a previously complex installation procedure to a fairly simple, one person process.

In one embodiment, the mounting bracket includes a number of pins projecting from an alignment plate. Initially, one of the brackets is mounted to each spaced end of the sliding rail assembly. Then, the sole installer inserts the pins projecting from the mounting bracket at the back end of the sliding rail assembly into a rear post of the rack. The pins projecting from the alignment plate on the rear of the sliding rail are inserted into mounting apertures in the rear post of the rack. This temporarily suspends the sliding rail assembly while the installer can pivot or otherwise position the mounting bracket on the front end of the sliding rail assembly into the associated front post of the rack. The mounting bracket at the front end of the sliding rail can then be fastened to the rack with appropriate screws, bolts or other fasteners. Once this is accomplished, the back mounting bracket at the rear end of the sliding rail can likewise be secured to the rear post of the rack.

An additional benefit to the one person installation procedure provided by this invention is the ability for the mounting bracket to float relative to the mating flange of the sliding rail assembly thereby allowing the sliding rail assembly to account for the tolerance problems of the server or other electronic component and reduce or eliminate tolerance stack-up. With the rack rail/alignment plate and associated bracket installed in the rack, only the alignment plate is fixedly secured or mounted to the post and the rack. While still being securely retained, the rack rail is loosely coupled to the bracket and alignment plate and can therefore translate, rotate, pivot or otherwise adjust to account for tolerance, misalignment or other potential problems with the system being installed. Specifically, the system accounts for servers or other electronic equipment enclosures that are slightly narrow or excessively wide relative to the rack system. Additionally, rack systems, servers or other electronic equipment enclosures that are not perfectly square are accounted for by rotation or pivoting of the alignment plate and associated bracket relative to the sliding rail. As such, the sliding rails do not bind, become jammed, or malfunction when in service because of potential tolerance stack-up problems. The design of the mounting bracket inhibits appreciable vertical translation of the sliding rail thereby providing for proper clearance for the rack space below.

This invention addresses both the single person install and tolerance stack-up issues. The alignment plate allows for very efficient and easily accomplished installation while still reducing or eliminating tolerance stack-up issues and providing a sliding rail assembly for the server or other electronic equipment to thereby provide more complete access to the equipment installed in the rack.

These and other advantages and features, which characterize the invention, are set forth in the claims annexed hereto and forming a further part hereof. However, for a better understanding of the invention, and of the advantages and objectives attained through its use, reference should be made to the drawings, and to the accompanying descriptive matter, in which there is described exemplary embodiments of the invention.

BRIEF DESCRIPTION OF THE DRAWINGS

The objectives and features of the invention will become more readily apparent from the following detailed description taken in conjunction with the accompanying drawings in which.

DETAILED DESCRIPTION

Figure 3:
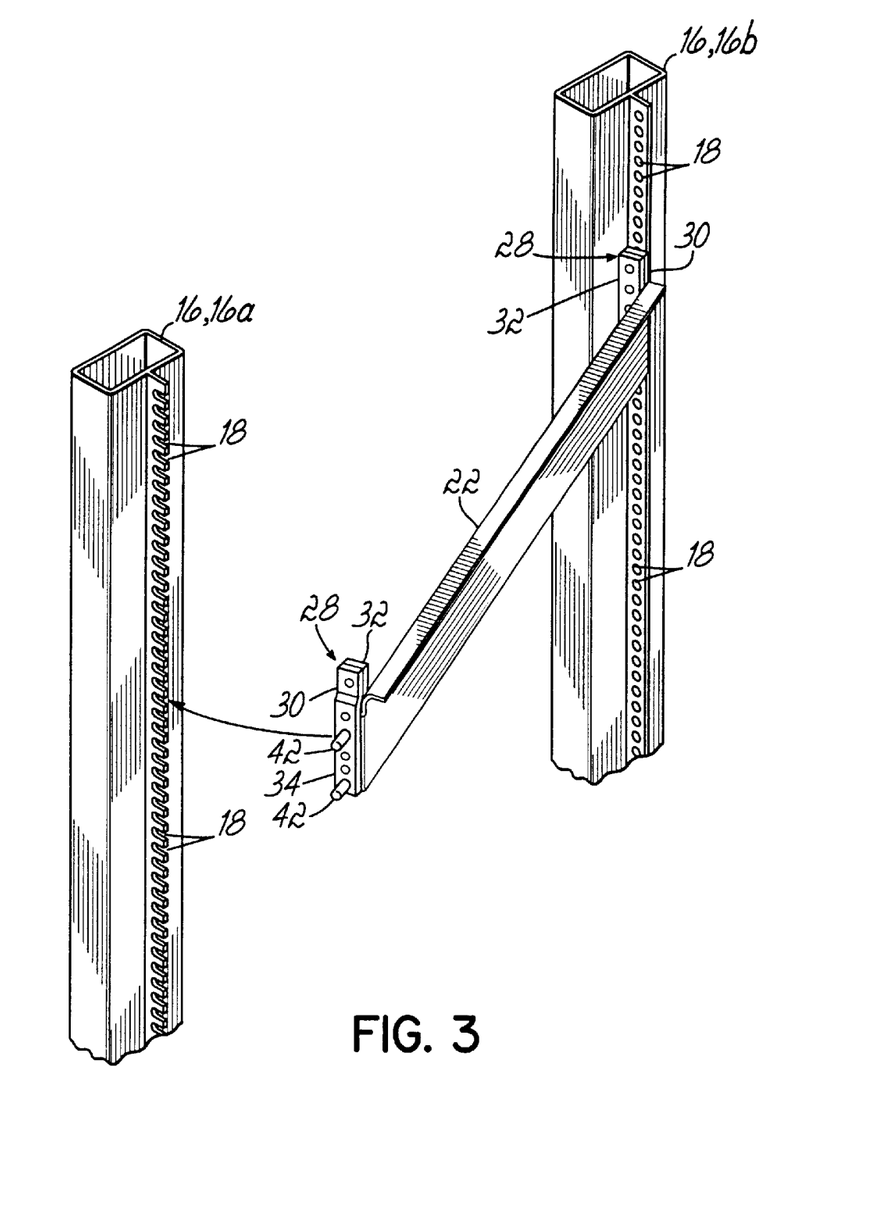
FIG. 3 is a view similar to FIG. 1 with the mounting bracket on a front end of the sliding rail assembly being installed into a front post of the rack.
Figure 4:
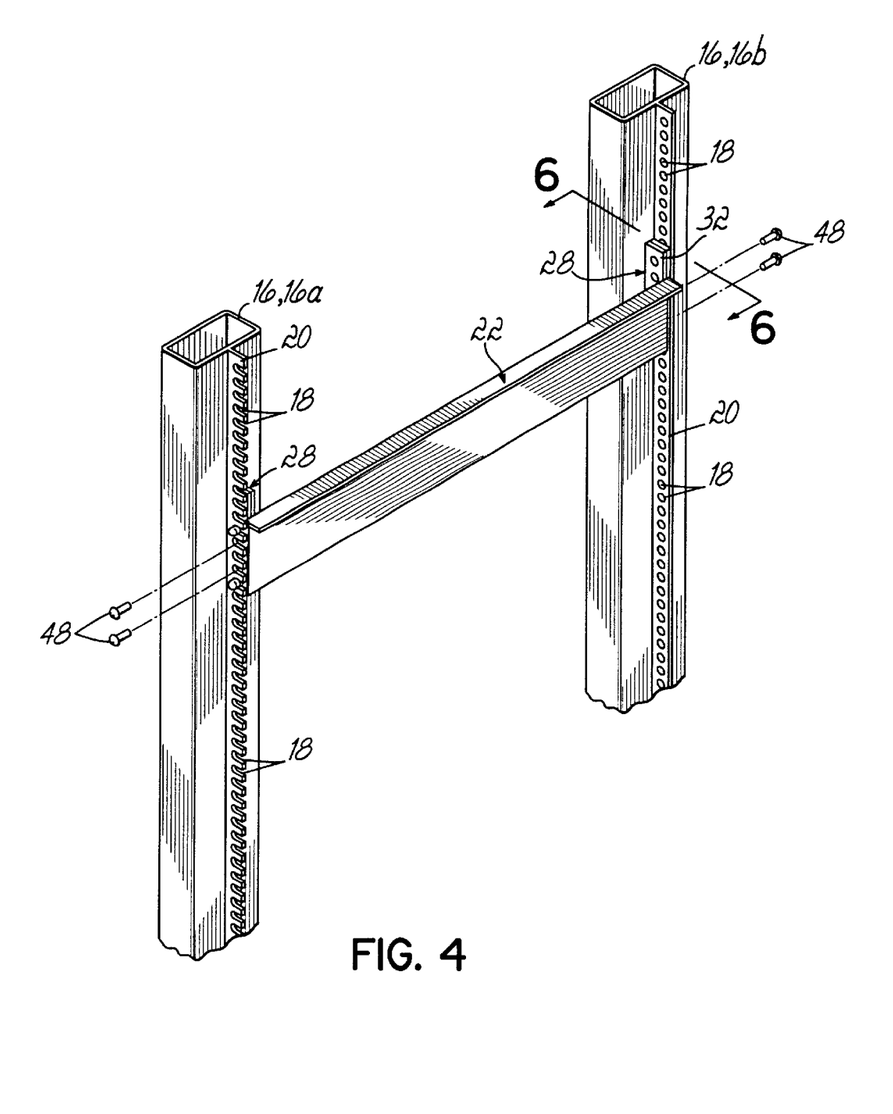
FIG. 4 is a view similar to FIGS. 1 and 3 with the mounting bracket on the sliding rail assembly being installed on the post and secured thereto by mechanical fasteners.
Figure 5:
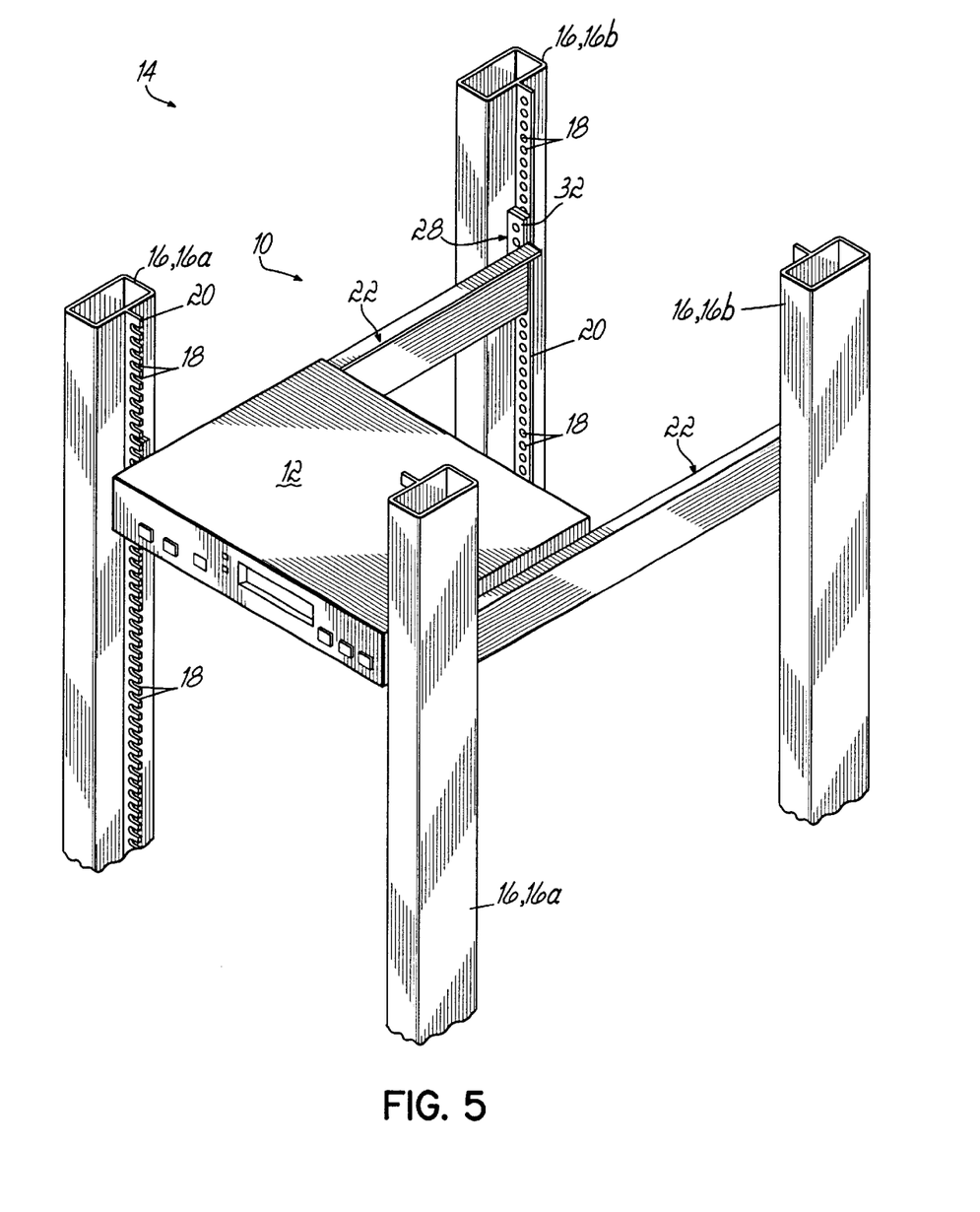
FIG. 5 is a view of a rack system with a server or electronic component installed on a pair of sliding rails.

Referring to the figures and specifically FIGS. 1–5, a system 10 and associated method for installing an equipment enclosure such as a server or other electronic equipment component 12 in a rack 14 is shown. As shown in FIG. 5, the rack, as is well known in the industry, commonly includes four spaced columns or posts 16 including a pair of front posts 16a and a pair of rear posts 16b in which each of the front posts is aligned with the rear posts. Each of the posts includes a number of spaced and arranged mounting apertures 18 on a flange 20 projecting from an interior side of the post 16. Preferably, the apertures 18 are spaced, sized and configured according to EIA standards. The apertures may be generally circular or square through holes, generally U-shaped slots or another configuration. Moreover, although a particular design and configuration of the rack 14, posts 16 and mounting apertures 18 are shown and described herein, it should be readily understood by one of ordinary skill in the art that this invention is applicable to a rack of any design and configuration.

Figure 1:
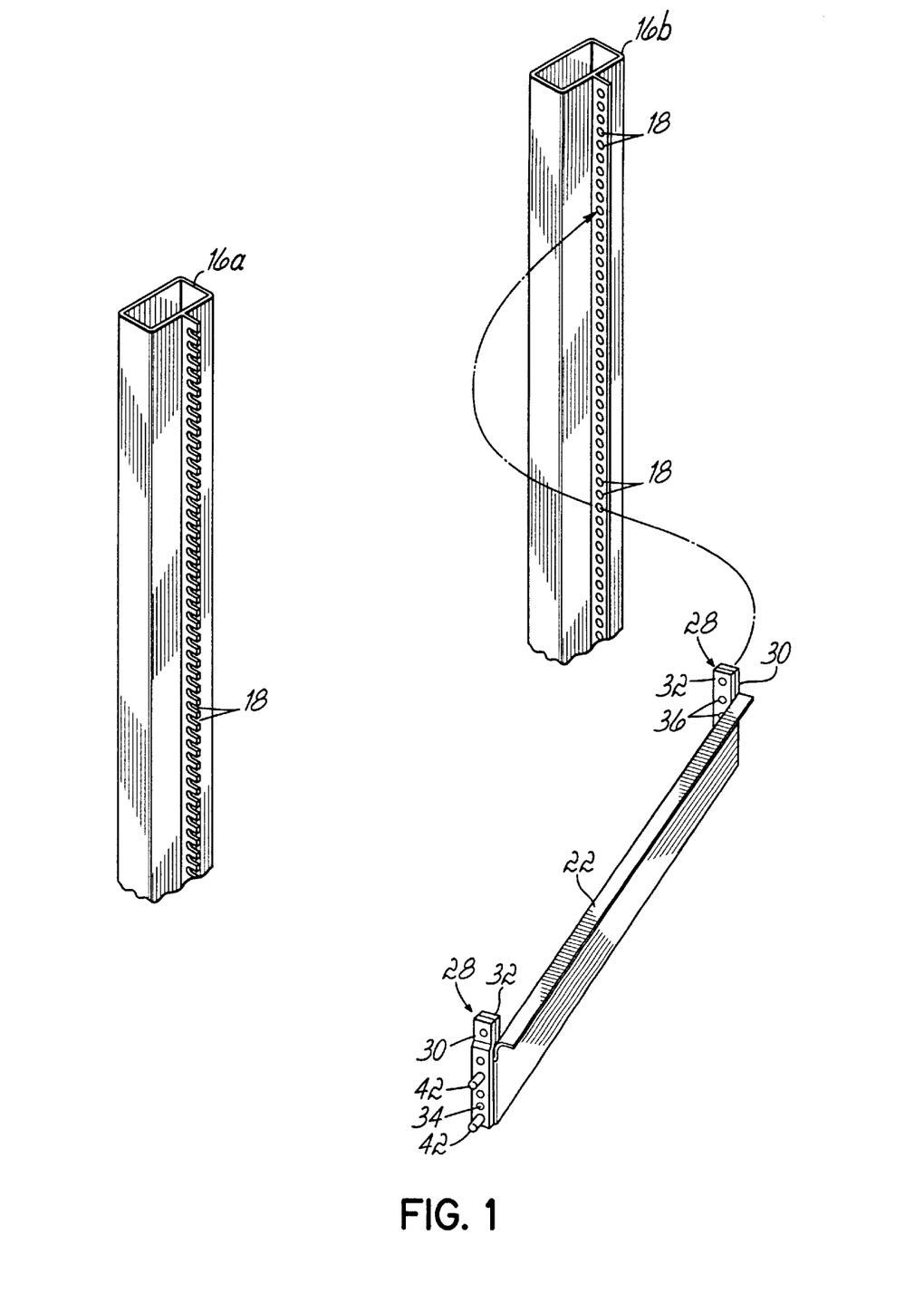
FIG. 1 is a perspective view of a pair of associated posts of a rack to which a sliding rail assembly incorporating mounting brackets according to one embodiment of this invention is being installed.
Figure 2:
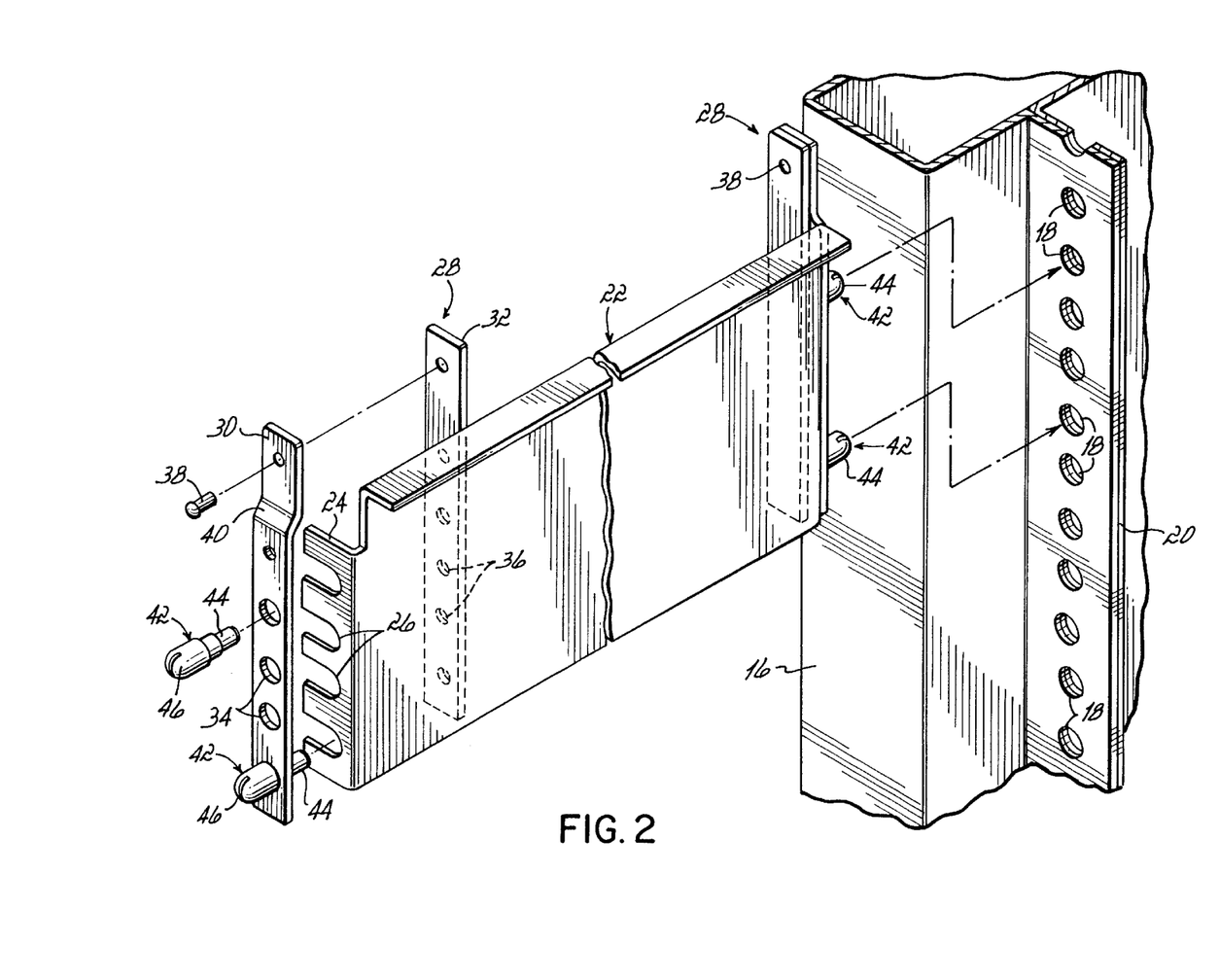
FIG. 2 is an enlarged view similar to FIG. 1 with one of the brackets of this invention exploded showing the components thereof.

Referring once again to FIGS. 1–5, the server or other component of electronic equipment enclosure is mounted in the rack by a pair of rail assemblies 22. Each rail assembly extends between an associated front post 16a and rear post 16b to support one side of the server (FIG. 5). As shown particularly in FIG. 2, the rail assembly accordingly to one embodiment of this invention is a sliding rail assembly 22 which allows for a service technician, installer or other person to slide the server or other electronic component out of the rack for full access to the entire component. In one exemplary embodiment as shown in FIG. 2, the sliding rail 22 includes a flange 24 projecting generally perpendicularly from a longitudinal axis of the rail 22. A rail flange 24 is provided at each of the opposite ends of the rail 22. Each rail flange 24 includes a number of mounting slots 26. Each sliding rail 22 is coupled to one side of the server 12 as is well known in the industry.

Referring specifically to FIGS. 2–3, one embodiment of a mounting bracket according to this invention is shown. The mounting bracket 28 provides for the efficient and secure mounting of the sliding rail 22 to the posts 16 of the rack 14 by a single installer. Moreover, the mounting bracket accounts for tolerance stack-up and misalignment issues to provide for smooth and efficient operation of the sliding rail 22 and rack-mounted server 12. In one embodiment, the mounting bracket includes an alignment plate 30 and a back-up plate 32. The alignment plate 30 includes a number of alignment holes 34. Likewise, the back-up plate 32 also includes a number of holes 36. The alignment plate and back-up plate are fixedly secured or mounted together in the mounting bracket 28 according to one embodiment of this invention. A rivet 38 or other fastening means is provided for this purpose.

The alignment plate includes a jog 40 so that a portion of the alignment plate is spaced from the generally planer back-up plate as shown particularly in FIGS. 2 and 3. The spacing between the back-up plate 32 and alignment plate 30 provided by the jog 40 allows for one of the flanges 24 of the rail 22 to be inserted between the back-up plate and alignment plate with the respective holes/slots 26, 34 and 36 being generally aligned.

The mounting bracket according to one embodiment of this invention also includes a number of pins 42 that can be selectively inserted into the aligned holes/slots 26, 34 and 36 of the mounting bracket 28 and rail flange 24. When a stem 44 of the pin is inserted through the aligned holes/slots 26, 34 and 36, a head 46 of the pin projects from the mounting bracket 28. Advantageously, the head 46 of each pin 42 may be inserted into one of the mounting apertures 18 in the post 16 to at least temporarily mount and retain the associated end of the sliding rail 22 to the post 16 in the rack 14. Specifically, the pins 42 of the mounting bracket 28 allow a single installer to position and temporarily hold one end of the rail 22 in one of the posts 16 as shown in FIG. 1. Subsequently, the installer pivots, rotates or otherwise moves the opposite end of the rail toward the associated post 16 so that the pins of that mounting bracket may be likewise positioned in the mounting apertures of the associated post to temporarily support the rail 22 (FIG. 3). Preferably, while the mounting bracket 28 on the back end of the rail 22 is mounted onto the rail 22, the mounting bracket 28 associated with the front end of the sliding rail 22 is not attached to the rail 22 before installation into the rack 14. The front mounting bracket 28 is attached to the mounting apertures 18 on the front post 16a and the rail 22 is installed by inserting the heads 46 of the pins 42 on the rear mounting bracket 28 into the mounting apertures 18 on the rear post 16b and then rotating the rail 22 so that the rail flange 24 is inserted between the alignment plate 30 and back up plate 32 of the front mounting bracket 28 attached to the front post 16a. The U-shaped mounting slots 26 allow for easier mating of the front rail flange 24 with the front mounting bracket 28. The rail 22 is then secured to the posts 16a, 16b with fasteners 48.

Once the rail 22 is supported on the post 16a, 16b by the pins 42, additional mechanical fasteners 48 such as screws, bolts or the like are also inserted into and through the mounting apertures in each post and the holes 34 in the mounting bracket 28 to fixedly secure the mounting bracket to the posts (FIG. 4). Advantageously, this can all be accomplished by a single installer while the rail is held in place on the post 16 by the pins 42 of the mounting bracket 28. A similar procedure is repeated for the rail 22 on the opposite side of the server 12 to thereby install the server in the rack 14 in a simple and efficient yet secure manner by a single installer.

In use, the following procedure can be utilized by even a single installer to mount an equipment enclosure such as a server or other electronic component 12 to a rack 14. While an installer could employ this method in a variety of contexts, it would generally be useful when dealing with a traditional rack 14 which has at least four spaced generally vertical posts 16 containing a plurality of mounting apertures 18.

The mounting or installation is accomplished by coupling a pair of rail assemblies 22 to the sides of an equipment enclosure. These rails 22 will support the server or other electronic component 12. More specifically, a mounting bracket 28 is coupled to each end of the rails 22. In an alternative method, this coupling is accomplished so as to provide for movement of the mounting bracket 28 relative to the rail 22. Each of these mounting brackets 28 also have at least one pin 42 projecting from them. The installation is then furthered by inserting at least one pin 42 on the first end of each rail 22 into one of the mounting apertures 18 in one of the posts 16 of the rack 14. This, at least temporarily, mounts the fist end of the rail 22 to the post 16. Next, an installer positions at least one pin 42, projecting from the mounting bracket 28 on the second end of each rail 22, into one of the mounting apertures 18 in another one of the posts 16. The process is completed by fixedly securing the mounting brackets 28, on the ends of each rail 22, to the associated post 16.

An alternative method can also include selectively inserting multiple pins 42 into the alignment holes 26, 34, 36 in the mounting brackets 28 and in the mounting holes 18 in each of the associated rails 22. Another alternative method can include restricting vertical movement of the rails 22 to thereby provide clearance for an adjacent equipment enclosure. Finally, an alternative method can include pivoting or rotating the second end of each rail 22 toward the associated post 16.

Figure 6A:
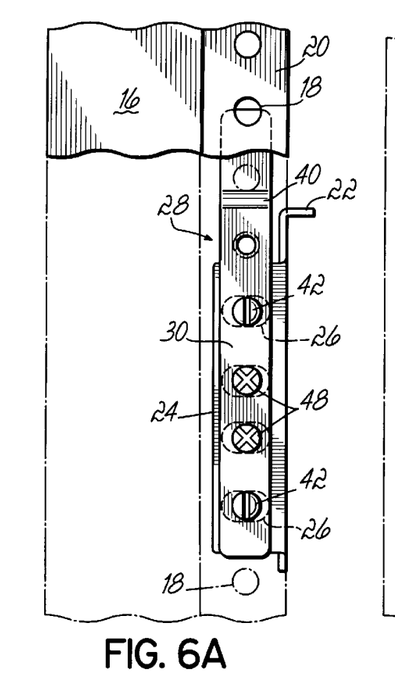
FIGS. 6A–6C are various cross-sectional views taken on line 6—6 of FIG. 4 of the mounting bracket orientation relative to the associated sliding rails assembly, and showing correction of potential tolerance stack-up problems.
Figure 6B:
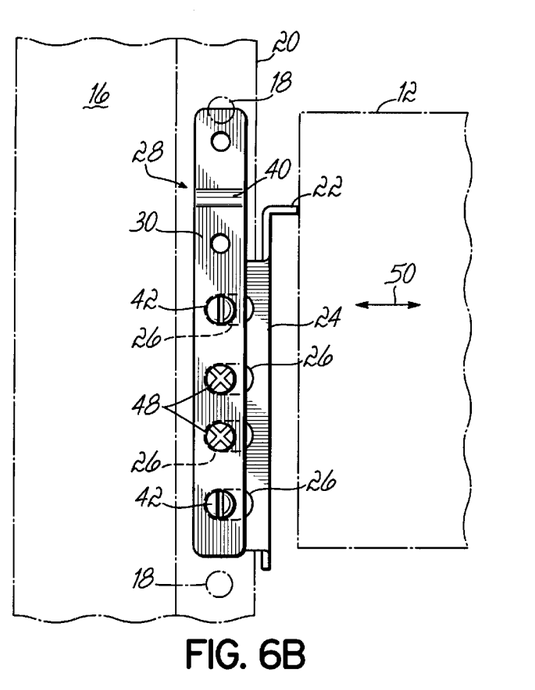
Figure 6C:
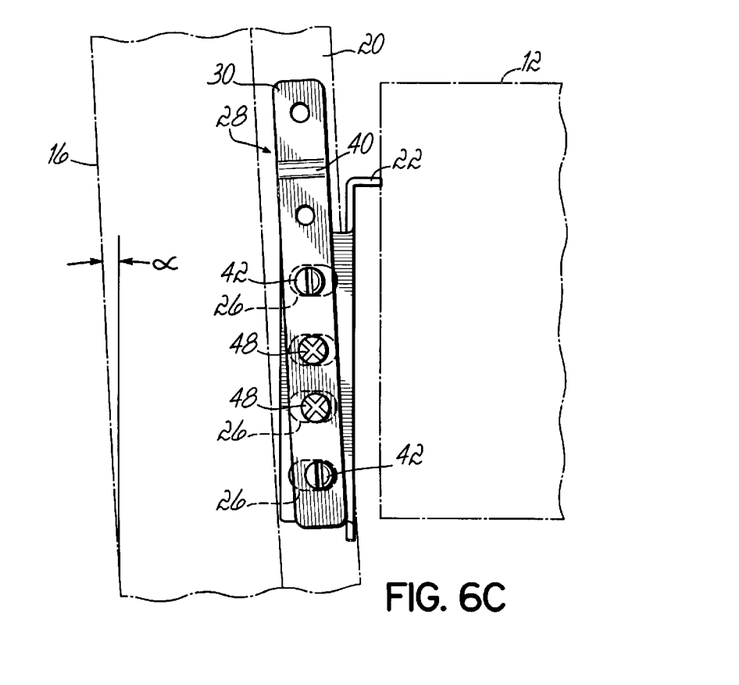

Another beneficial aspect of this invention is shown particularly in FIGS. 6A–6C. Specifically, while the mounting bracket 28 is securely and fixedly mounted to the mounting apertures 18 of the posts 16 in the rack 14, the sliding rails 22 are movable relative to the mounting bracket 28 while still being securely retained therein. Specifically, the rail is loosely coupled to the mounting bracket 28 and alignment plate, and can therefore translate, rotate or otherwise move relative thereto to accept tolerance problems and avoid tolerance stack-up issues. FIGS. 6A and 6B show installation of the server 12 if it is too wide (FIG. 6A) or too narrow (FIG. 6B) relative to the spacing between the posts 16 of the rack 14, as shown by directional arrow 50. Additionally, servers 12 that are not perfectly square or in alignment with the posts 16 of the rack 14 are accounted for, as shown in FIG. 6C, because the rail 22 is permitted to rotate or pivot through an angle identified as a in FIG. 6C relative to the post 16. The ability for the rails to move relative to the mounting bracket allows for tolerance issues to work themselves out without binding or malfunctioning of the rails 22. The design of the mounting bracket 28 inhibits appreciable vertical translation of the sliding rail 22 thereby providing for proper clearance for the rack space below.

This invention addresses both the single person installation and tolerance stack-up issues. The mounting bracket and associated alignment plate allow for a very efficient and easy installation method. Additionally, the mounting bracket aligns the server being installed into the rack by reducing tolerance stack-up problems. With this invention, an easily installable, fully serviceable sliding rail installation assembly and method is available for rack-mounted servers or other electronic equipment enclosure components.

From the above disclosure of the general principles of the present invention and the preceding detailed description of at least one preferred embodiment, those skilled in the art will readily comprehend the various modifications to which this invention is susceptible. Therefore, we desire to be limited only by the scope of the following claims and equivalents thereof.

What is claimed is:

1. A system for mounting an equipment enclosure to a rack, wherein the rack comprises at least four spaced, generally vertical posts and each post includes a plurality of mounting apertures, the system comprising:

a first and a second sliding rail each having spaced ends and adapted to be coupled to spaced first and second sides, respectively, of the equipment enclosure;

a flange projecting from each end of each rail;

a plurality of mounting holes in each flange on each end of each rail;

a plurality of mounting brackets to mount each end of each rail to one of the posts of the rack, each of the mounting brackets including an alignment plate;

a back-up plate fixedly mounted to the alignment plate;

a spacing between at least a portion of the alignment plate and at least a portion of the back-up plate;

wherein the flange projecting from each end of each rail is positioned in the spacing between the alignment plate and the back-up plate;

a plurality of alignment holes in the alignment plate of each mounting bracket;

a plurality of pins each selectively positioned in one of the alignment holes in one of the mounting brackets;

wherein the pins project through one of the mounting holes in the flange to couple the mounting bracket to the associated rail;

wherein the pins are adapted to be positioned in the apertures of one of the posts to at least temporarily retain the associated rail and mounting bracket to one of the posts during installation of the associated rail; and a plurality of fasteners inserted into the mounting bracket and the mounting apertures to secure the mounting bracket and associated rail coupled thereto to the associated post of the rack;

wherein the mounting bracket is fixedly secured to the post by the fasteners and the associated rail is movable relative to the rack to account for tolerance stack-up in the mounting of the equipment enclosure to the rack.

2. The system of claim 1 wherein the alignment plate is misaligned with respect to the associated flange on the rail to account for tolerance stack-up in the mounting of the equipment enclosure to the rack.

3. The system of claim 2 wherein the alignment plate is generally aligned with the mounting apertures in the associated post.

4. The system of claim 2 wherein the flange is pivoted relative to the associated alignment plate.

5. The system of claim 2 wherein the flange is translated relative to the associated alignment plate.

6. The system of claim 2, wherein the mounting bracket restricts vertical movement of the associated rail to provide clearance for an adjacent equipment enclosure.

7. A system for mounting an equipment enclosure to a rack, wherein the rack comprises at least four spaced, generally vertical posts and each post includes a plurality of mounting apertures, the system comprising:

a first and second rail each having spaced ends and adapted to be coupled to spaced first and second sides, respectively, of the equipment enclosure;

a flange projecting from each end of the rail;

a plurality of mounting holes in each flange on each end of each rail;

a plurality of mounting brackets to mount each end of each rail to one of the posts of the rack, each of the mounting brackets including an alignment plate;

a back-up plate fixedly mounted to the alignment plate;

a spacing between at least a portion of the alignment plate and at least a portion of the back-up plate;

wherein the flange projecting from each end of each rail is positioned in the spacing between the alignment plate and the back-up plate;

at least one pin projecting from selected ones of the mounting brackets;

wherein the at least one pin projects through one of the mounting holes in the flange to couple the mounting bracket to the associated rail;

wherein the at least one pin is adapted to be positioned in one of the apertures of one of the posts to at least temporarily retain the associated rail and mounting bracket to one of the posts during installation of the associated rail; and a plurality of fasteners inserted into the mounting bracket and the mounting apertures to secure the mounting bracket and associated rail coupled thereto to the associated post of the rack.

8. A system for mounting an equipment enclosure to a rack, wherein the rack comprises at least four spaced, generally vertical posts and each post includes a plurality of mounting apertures, the system comprising:

a first and a second generally horizontal rail each having a longitudinal spaced front end and rear end adapted to be coupled to spaced first and second sides, respectively, of the equipment enclosure;

a rail flange projecting from the front end and the rear end of each generally horizontal rail;

a plurality of mounting slots in each rail flange on the front end and the rear end of each generally horizontal rail;

a plurality of generally vertical mounting brackets to mount the front end and the rear end of each generally horizontal rail to one of the posts of the rack, each of the generally vertical mounting brackets including an alignment plate;

at least one pin projecting from the generally vertical mounting brackets;

wherein the at least one pin projects through one of the plurality of mounting slots in the rail flange to couple the generally vertical mounting bracket to the associated generally horizontal rail;

wherein the at least one pin is adapted to be positioned in one of the apertures of one of the posts to temporarily retain the associated generally horizontal rail and generally vertical mounting bracket to one of the posts during installation of the associated generally horizontal rail; and a plurality of fasteners inserted into the plurality of mounting slots in the rail flange to permanently secure the attached generally vertical mounting bracket and associated generally horizontal rail coupled thereto to the associated post of the rack.

9. A method of mounting an equipment enclosure to a rack, wherein the rack comprises at least four generally vertical posts and each post includes a plurality of mounting apertures, the method comprising the steps of:

coupling first and second generally horizontal rails, each having first and second longitudinal spaced ends, to first and second sides, respectively, of the equipment enclosure;

coupling a generally vertical mounting bracket to each end of the generally horizontal rails, each generally vertical mounting bracket having a plurality of mounting slots and at least one pin projecting from the plurality of mounting slots;

inserting the at least one pin on the first end of each generally horizontal rail into one of the mounting apertures in one of the posts of the rack and thereby temporarily mounting the first end of the generally horizontal rail to the post;

positioning the at least one pin projecting from the generally vertical mounting bracket on the second end of each generally horizontal rail into one of the mounting apertures in another one of the posts; and inserting a fastener into the plurality of mounting slots in the generally vertical mounting bracket thereby permanently securing the generally vertical mounting brackets, on the ends of each generally horizontal rail, to the associated post.

* * * * *